(12) United States Patent
Lu et al.

(10) Patent No.: US 7,077,943 B2
(45) Date of Patent: Jul. 18, 2006

(54) BARIUM TITANATE FILM SYNTHESIZING PROCESS

(75) Inventors: Fu-Hsing Lu, Taichung (TW); Chu-Tsun Wu, Hsinchu (TW)

(73) Assignee: National ChungHsing University, Taichung (TW)

( * ) Notice: Subject to any disclaimer, the term of this patent is extended or adjusted under 35 U.S.C. 154(b) by 257 days.

(21) Appl. No.: 10/612,007

(22) Filed: Jul. 3, 2003

(65) Prior Publication Data
US 2005/0003078 A1    Jan. 6, 2005

(51) Int. Cl.
*C25D 11/02* (2006.01)
(52) U.S. Cl. ............... 205/189; 205/316; 205/333; 205/538
(58) Field of Classification Search ......... 205/316, 205/189, 333, 538; 427/126.3
See application file for complete search history.

(56) References Cited

U.S. PATENT DOCUMENTS 6,344,411 B1 * 2/2002 Yamada et al. ......... 438/653

OTHER PUBLICATIONS

Wu, C.Y.; Lu, F.H. Thin Solid Films 2001, 398-399, p. 621-625.*
Mattox, D.M. "Thin Films, Film Formation Techniques." Kirk-Othmer Encyclopedia of Chemical Technology 1997. Accessed online. DOI; 10.1002/0471238961. 0609121313012020.a01.*

* cited by examiner

*Primary Examiner*—Roy King
*Assistant Examiner*—William T. Leader
(74) *Attorney, Agent, or Firm*—Bacon & Thomas, PLLC

(57) ABSTRACT

A new technique to synthesize barium titanate ($BaTiO_3$) on homogeneous substrates (titanium) or heterogeneous substrates (silicon wafers, metal, glass, ceramics, polymers, other metals, etc.) is disclosed to include a first step to deposit a titanium film on a substrate by sputtering, and a second step to synthesize barium titanate film with uniformly dispersed spherical particles on the titanium-coated substrate in a electrolyte containing barium ions by electrochemically anodic oxidation.

12 Claims, 6 Drawing Sheets

BARIUM TITANATE FILM SYNTHESIZING PROCESS

BACKGROUND OF THE INVENTION

1. Field of the Invention

The present invention relates to a thin film synthesizing process and, more specifically, to a barium titanate film synthesizing process to synthesize barium titanate film with uniformly dispersed particles at a low temperature close to room temperature within a short electrolytic duration.

2. Description of the Related Art

Barium titanium is an important functional material for the advantages of superior dielectric, ferroelectric and piezoelectric properties. Following fast development of technology, products are made thinner, lighter, shorter, and smaller. Barium titanate films have many applications. For example, in designing ULSI DRAM, $SiO_2/Si_3N_4$ is used as capacitance material. However, increasing capacitance area requires a three-dimensional stacking and geographical grooving design. Using barium titanate films to substitute for $SiO_2/Si_3N_4$ could maintain plane geometric structure under a reduced capacitance size.

Various methods have been used to synthesize barium titanate film, including sputtering, evaporation, chemical vapor deposition, laser coating, sol-gel, hydrothermal and electrochemical processes, etc. Electrochemical process is superior to the other methods for the advantages of simple set-up of instruments, low processing temperature, high deposition rate, and easy formation of crystallized film. Electrochemical deposition of barium titanate film can be achieved by cathodic reduction or anodic oxidation. Cathodic reduction often results in amorphous structure which must be further heat-treated to yield crystalline structure. Moreover, the film surface is generally porous. On the other hand, electrochemically anodic oxidation can also be used to synthesize barium titanate films on substrates in an alkaline solution of $Ba(OH)_2$ or $Ba(CH_3COO)_2$. Uniformly dispersed spherical particles are seen in barium titanate films synthesized by this method. The quality of barium titanate films synthesized by electrochemically anodic oxidation is superior to that obtained by cathodic reduction. Electrochemically anodic oxidation normally yields crystalline phase, hence no further heat treatment is necessary. However, titanium substrates must be used in electrochemically anodic oxidation. Manufacturers are developing economical processes with simple set-up of instruments and a considerably fast growth rate.

SUMMARY OF THE INVENTION

The present invention has been accomplished under the circumstances in view. It is the main object of the present invention to provide barium titanate film synthesizing process, which is capable of synthesizing a barium titanate film on a heterogeneous substrate by electrochemically anodic oxidation. It is another object of the present invention to provide a barium titanate film synthesizing process, which is economical. It is still another object of the present invention to provide a barium titanate film synthesizing process, which can synthesize a barium titanate film with uniformly dispersed particles on a substrate at a low processing temperature within a short electrolytic duration.

To achieve these and other objects of the present invention, the barium titanate film synthesizing process comprises the steps of (a) coating a titanium film on the surface of a substrate, and (b) synthesizing a barium titanate film on the titanium-coated substrate in an electrolyte containing barium ions by electrochemically anodic oxidation.

DETAILED DESCRIPTION OF THE INVENTION

The invention provides a new technique to synthesize barium titanate ($BaTiO_3$) on homogeneous substrates (titanium) or heterogeneous substrates (silicon wafers, glass, ceramics, polymers, other metals, etc.). According to the first embodiment of the present invention, the technique is to synthesize barium titanate films on heterogeneous substrates.

The method combines sputtering deposition of titanium films and electrochemically anodic oxidation. The process includes two steps. The first step is to deposit titanium films on silicon substrate by sputtering. The second step is to synthesize barium titanate films with uniformly dispersed spherical particles on Ti-coated substrates in a highly alkaline solution of $Ba(CH_3COO)_2$ and NaOH. In generally, the invention is to form a titanium seeding layer on a heterogeneous substrate, and then to synthesize a barium titanate film on the titanium seeding layer by electrochemically anodic oxidation.

Figure 1:
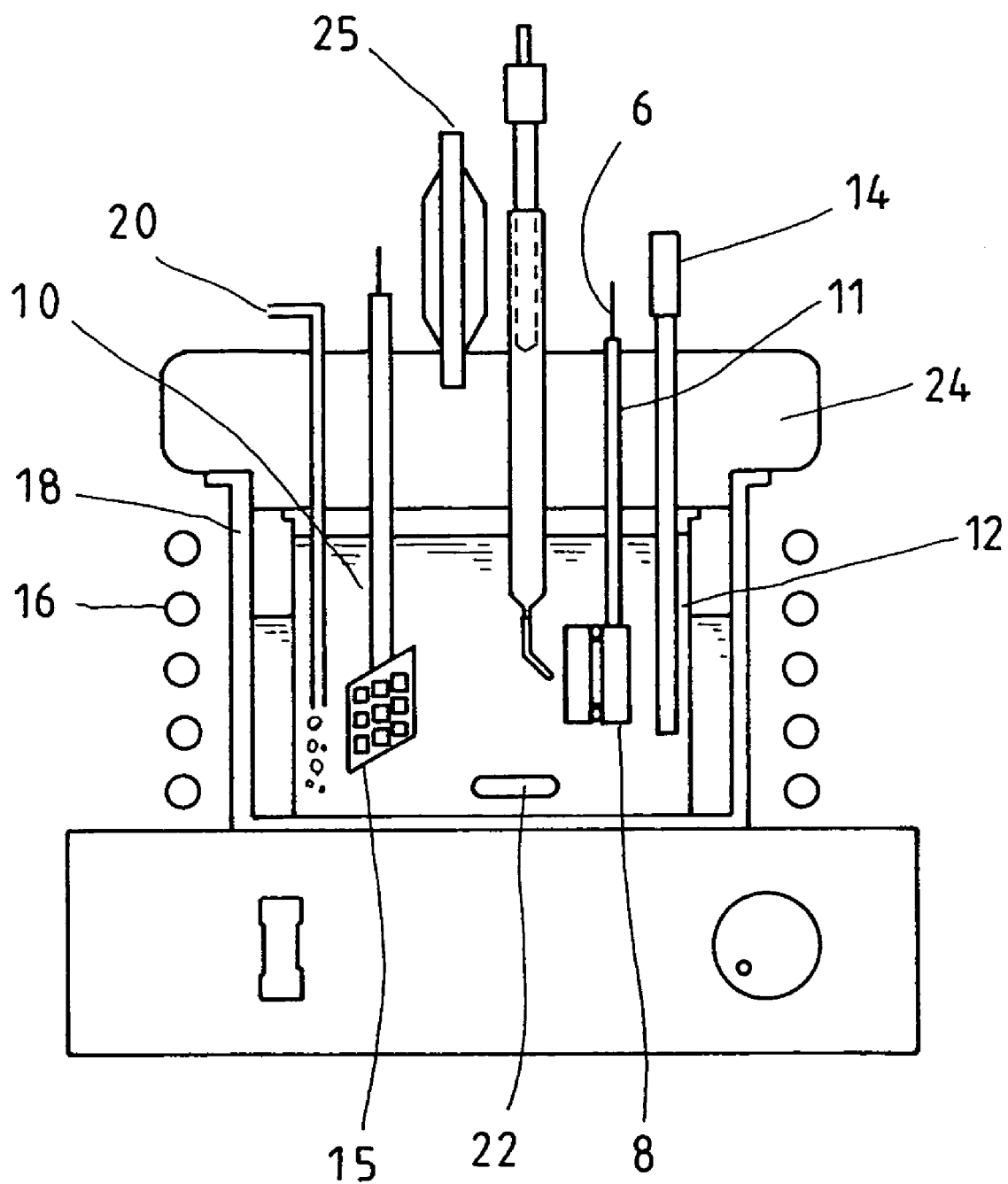
FIG. 1 is a schematic drawing showing the experimental set-up for the process according to the present invention.
Figure 2:
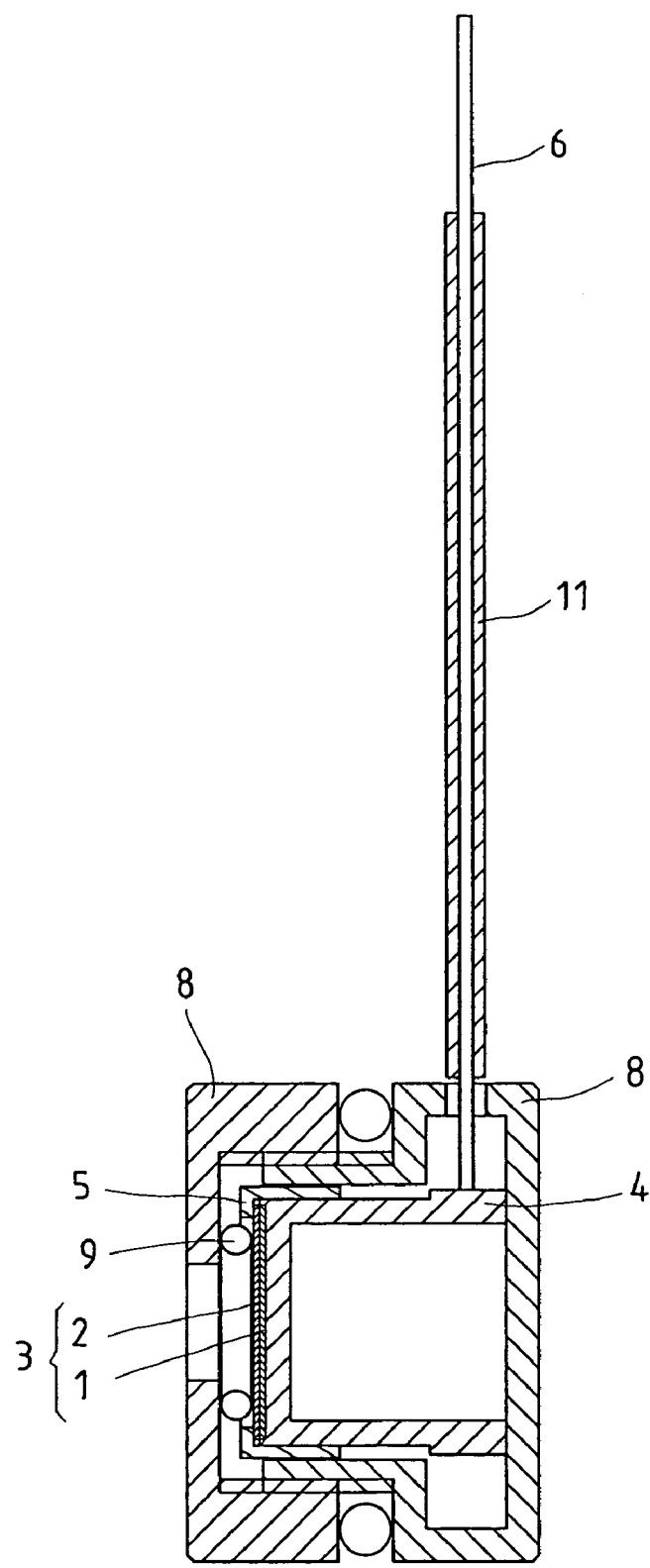
FIG. 2 is an enlarged view of a part of FIG. 1.

The method is outlined hereinafter by means of an example with reference to FIGS. 1 and 2. At first, a titanium film 1 was deposited on a P type (100) silicon wafer 2 by unbalanced magnetron sputtering to form a Ti-coated (titanium-coated) silicon wafer 3. The sputtering parameters are as in Table I. The film thickness is about 0.5 μm. In actual practice, other deposition methods, for example, evaporation may be employed. The film thickness is not critical as long as the film sustains throughout the anodic oxidation.

TABLE I

Process parameters for depositing titanium film on silicon wafer by unbalanced magnetron sputtering

| | |
|---|---|
| DC power | 30 W |
| Working pressure (Ar) | 1.5 mTorr |
| Titanium Purity | 99.5% |
| Substrate temperature | 300° C. |
| Substrate-target distance | 35 cm |
| Deposition rate | 5 nm/min |
| Thickness of titanium film | ~0.5 μm |

Thereafter, the Ti-coated silicon wafer 3 was cleaved into a sample strip of size 12.5 mm×12.5 mm, and then cleaned with acetone in an ultrasonic cleaner. After cleaning, the back side of the Ti-coated silicon wafer 3 was put on a cylindrical copper holder 4, and then an annular copper plate 5 was pressed on the border area of the front side of Ti-coated silicon wafer 3 against the cylindrical copper holder 4, and then a copper rod 6 was connected to the copper holder 4 for use as anode in electrolytic cell. And then, the copper holder 4 was put in a Teflon holder 8, and a silicon rubber gasket 9 was put in the annular copper plate 5 to seal the copper holder 4 from the electrolyte 10, and a Teflon sleeve 11 was sleeved onto the copper rod 6 and sealed with silicon glue, keeping the Ti-coated silicon wafer 3 in contact with the electrolyte 10. The exposed area of the sample strip (Ti-coated silicon wafer 3) was about 0.79 cm$^2$. A 250 ml Teflon beaker 12 was used as an electrolytic cell in the procedure. A K-type thermocouple was used to monitor the temperature of the electrolyte 10. A platinum plate 15 was used as the cathode. Further, a heating tape 16 was extended around the periphery of a 500 ml glass beaker 18 to heat water in the beaker 18. During the process, oxygen was continuously flowed into the electrolyte 10 through a Teflon tube 20, and a magnetic Teflon-coated spin bar 22 was used to stir the electrolyte 10. In order to reduce evaporation, a condensing tube 25 was installed in the Teflon cover, referenced by 24. The electrolyte 10 was a highly alkaline solution of Ba(CH$_3$COO)$_2$ and NaOH prepared in a Teflon beaker by means of the application of boiled secondary distilled water.

The sample strip (Ti-coated silicon wafer 3) was put in the electrolyte 10, and electrochemically anodic oxidation was started 30 minutes after the temperature of the electrolyte 10 had been reduced to and maintained at 55° C. During anodic oxidation, the processing temperature was maintained at 55° C. Electrochemically anodic oxidation was performed by means of a computer program via a GPIB interface to control power supply to gradually increase electrolytic voltage to 3 V under voltage scan rate 50 mV/s and then maintain the same electrolytic voltage about 24 hours. After electrochemically anodic oxidation, a barium titanate (BaTiO$_3$) film 28 was formed on the sample strip (hereinafter the barium titanate (BaTiO$_3$) film-coated sample strip was referenced by 30). The sample strip 30 was then dipped in hot ammonia water (pH~11), and then washed with deionized water, and then ultrasonically cleaned in ethanol for 1 minute, and then dried by baking.

Figure 3:
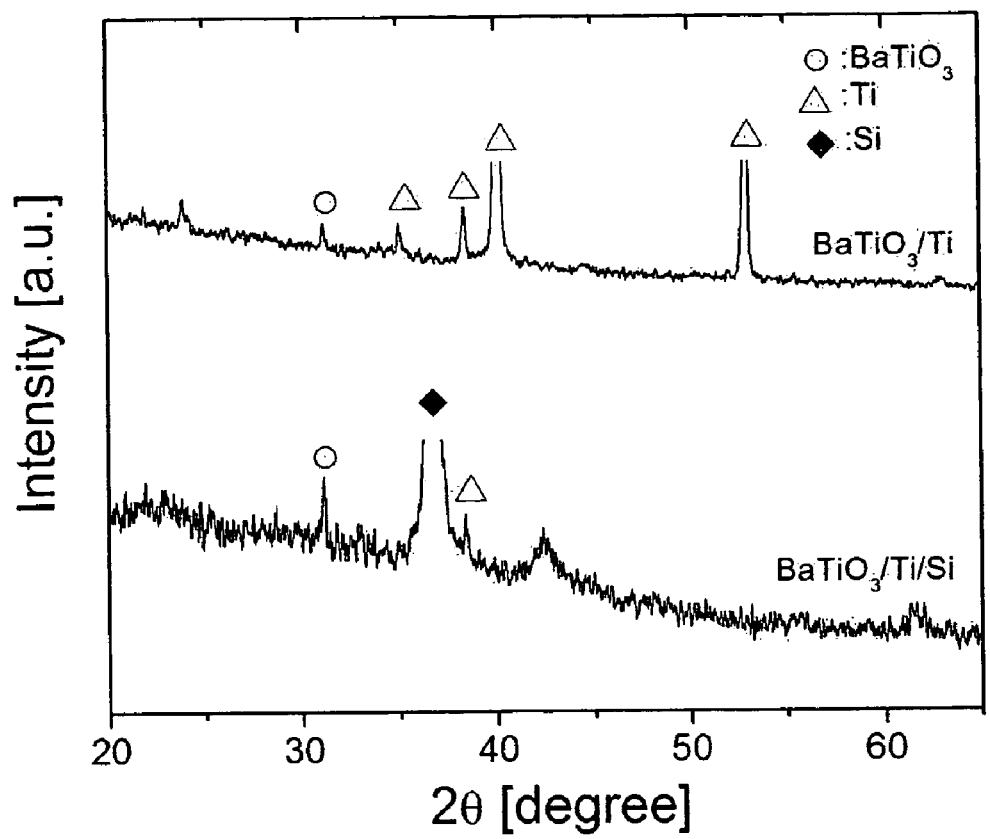
FIG. 3 is an X-ray diffraction spectrum of a finished product obtained according to the first embodiment of the present invention and a finished product obtained according to the prior art method.
Figure 4:
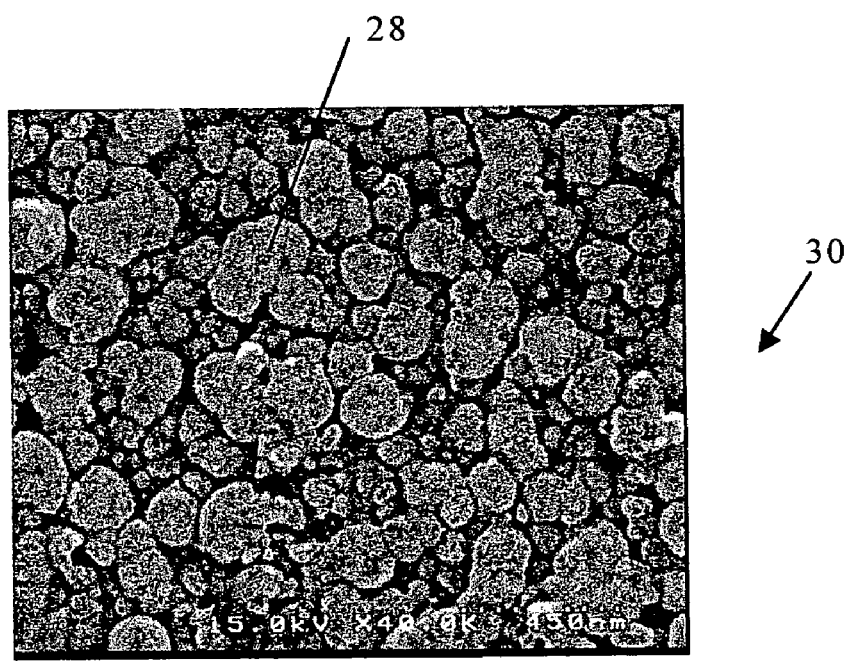
FIG. 4 is a microscopic picture of the surface of the finished product obtained according to the first embodiment of the present invention.
Figure 5:
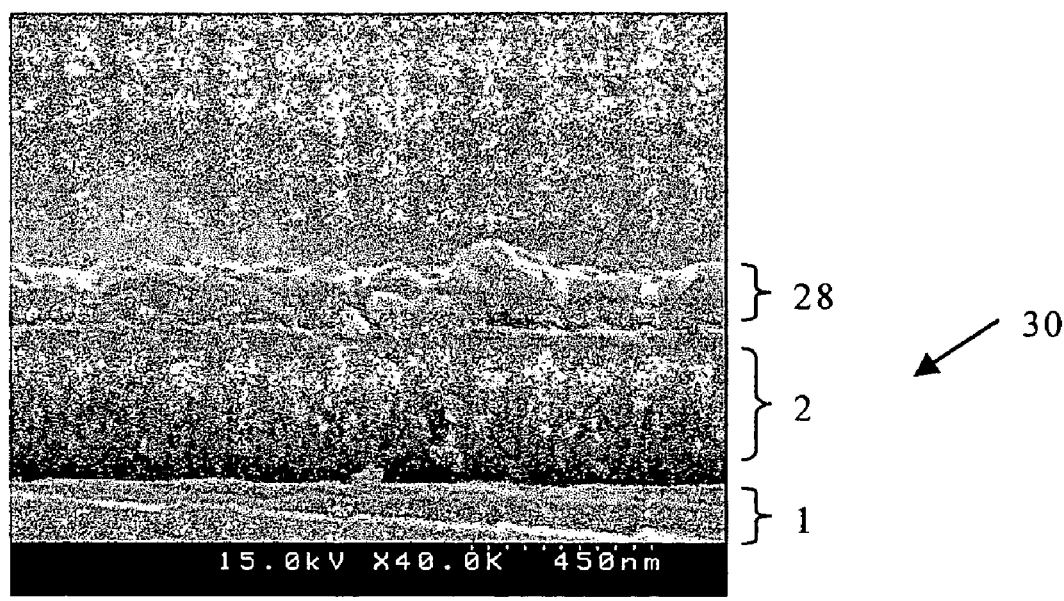
FIG. 5 is a microscopic picture of the cross section of the finished product obtained according to the first embodiment of the present invention.
Figure 6:
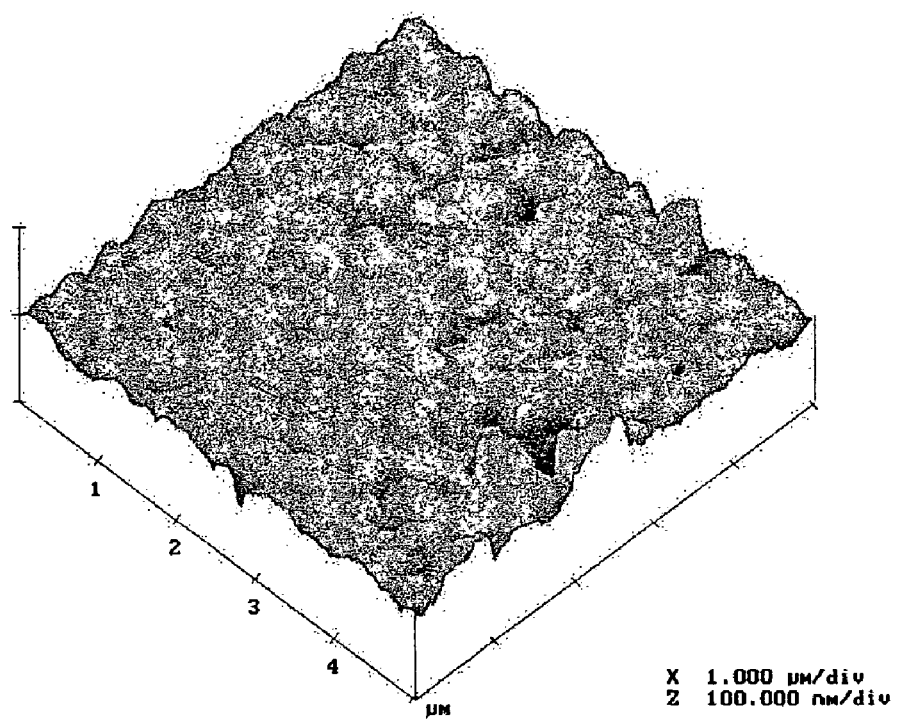
FIG. 6 is a microscopic picture showing the contour of the surface of the finished product obtained according to the first embodiment of the present invention.

As illustrated in FIG. 3, X-ray diffraction spectra show formation of a barium titanate (BaTiO$_3$) film on the sample strip 30 (see the lower curve in FIG. 3), which possesses the same crystalline structure as that synthesized by conventional anodic oxidation requiring bulk-Ti as substrate (see the upper curve in FIG. 3). FIG. 4 shows morphology of the sample strip 30 viewed under FE-SEM (Field-Emission Scanning Electron Microscope). The morphology shows the presence of a barium titanate (BaTiO$_3$) film with uniformly dispersed spherical particles, which is similar to that synthesized by conventional anodic oxidation requiring bulk-Ti as substrate. FIG. 5 is a cross-sectional view of the sample strip 30 observed under FE-SEM. As illustrated, the silicon wafer 1, the titanium film 2 and the barium titanate (BaTiO$_3$) film 28 are seen in the picture. The thickness of the barium titanate (BaTiO$_3$) film 28 is about 0.1 μm. The surface of the barium titanate (BaTiO$_3$) film 28 was observed by an AFM (Atomic Force Microscope), as shown in FIG. 6, showing Ra about 6 nm and Rq about 8 nm, i.e., the particles are uniformly dispersed on the surface of the barium titanate (BaTiO$_3$) film 28.

Figure 7:
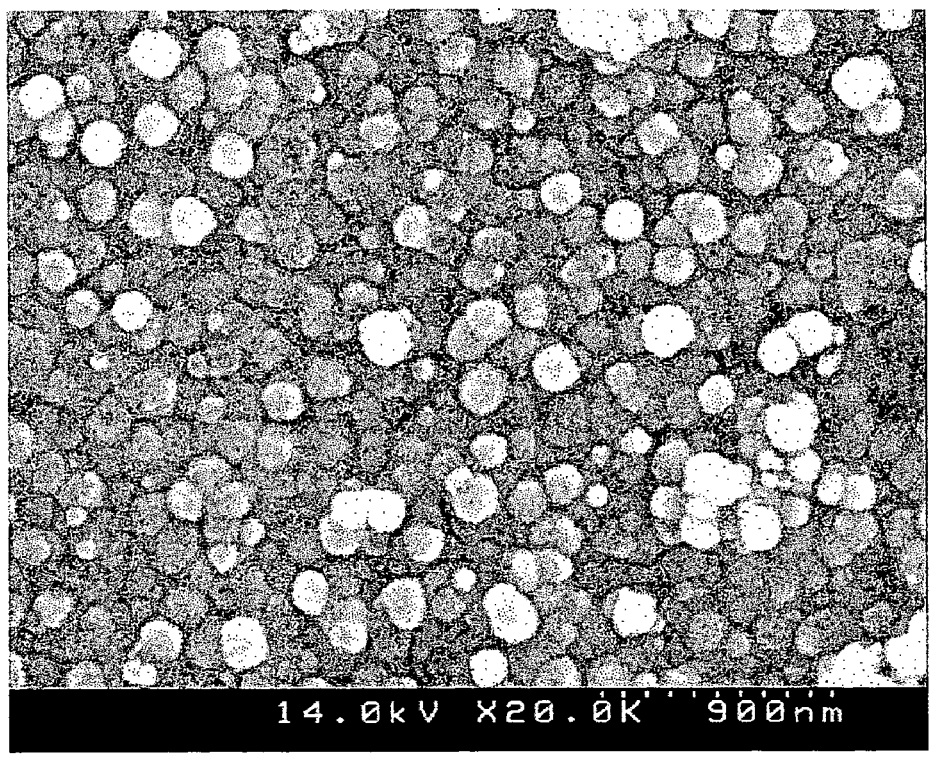
FIG. 7 is a microscopic picture of the surface of the finished product obtained according to the second embodiment of the present invention.
Figure 8:
FIG. 8 is a microscopic picture of the surface of a finished product obtained according to the prior art.

As illustrated in FIG. 7, barium titanate (BaTiO$_3$) film of thickness about 0.1 μm with uniformly dispersed spherical particles was formed under a voltage scan rate 10 mV/s at a low electrolytic voltage 0.4 V over a short electrolytic duration about 40 seconds. This example shows a rapid synthesis of barium titanate (BaTiO$_3$) film with uniformly dispersed spherical particles within a short duration at a processing temperature close to room temperature according to the present invention. When compared to conventional methods, the advantages of the invention become apparent. FIG. 8 shows the surface appearance of a barium titanate (BaTiO$_3$) film synthesized by anodic oxidation requiring bulk-Ti as substrate according to the prior art and observed by an FE-SEM. According to this prior art observation, even the end of scan voltage is relatively higher, the finally formed barium titanate particles are still considerably smaller. It is apparent that the formation of barium titanate film according to the present invention is faster than the prior art method.

In actual practice, the parameters for the second step of the process may be modified subject to requirements. For example, the concentration of Ba(CH$_3$COO)$_2$ could be ranging from 0.35 to 0.5 M; the concentration of NaOH is preferably at about 2 M; voltage scan speed could be ranging from 10 mV/s to 50 mV/s, end of scan voltage could be ranging from 0.4 V to 3V over a wide electrolytic duration from 20 seconds to 24 hours; the processing temperature could be ranging from 30° C. to 90° C.

Figure 9:
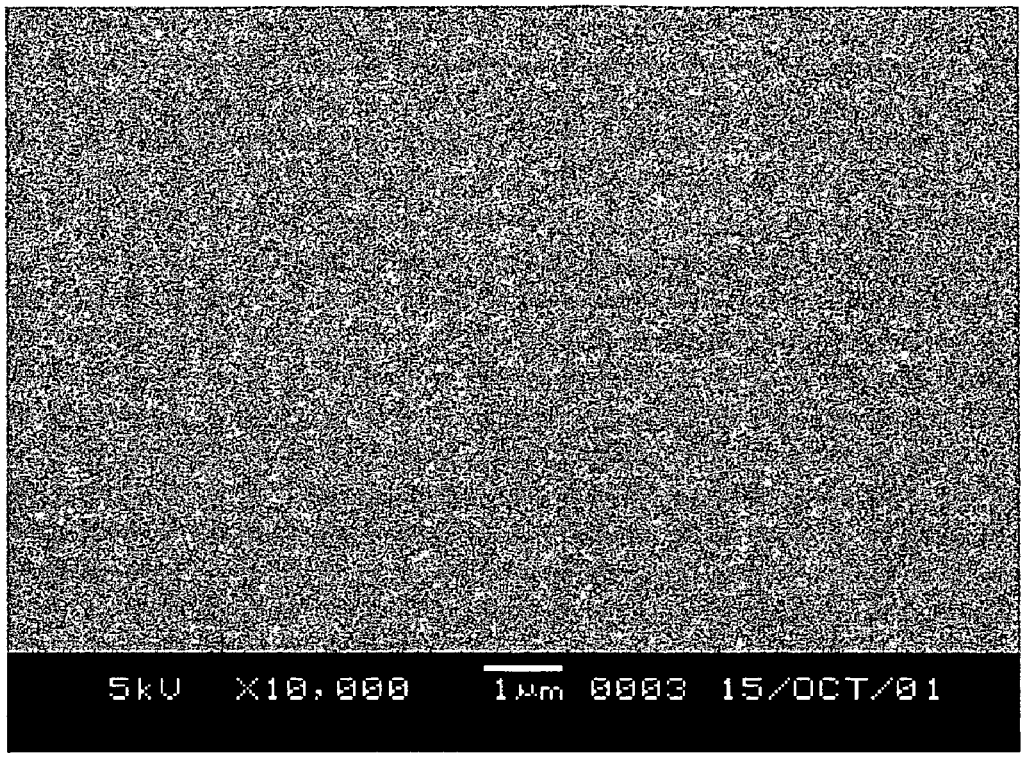
FIG. 9 is a microscopic picture of the surface of a titanium film made according to the present invention.
Figure 10:
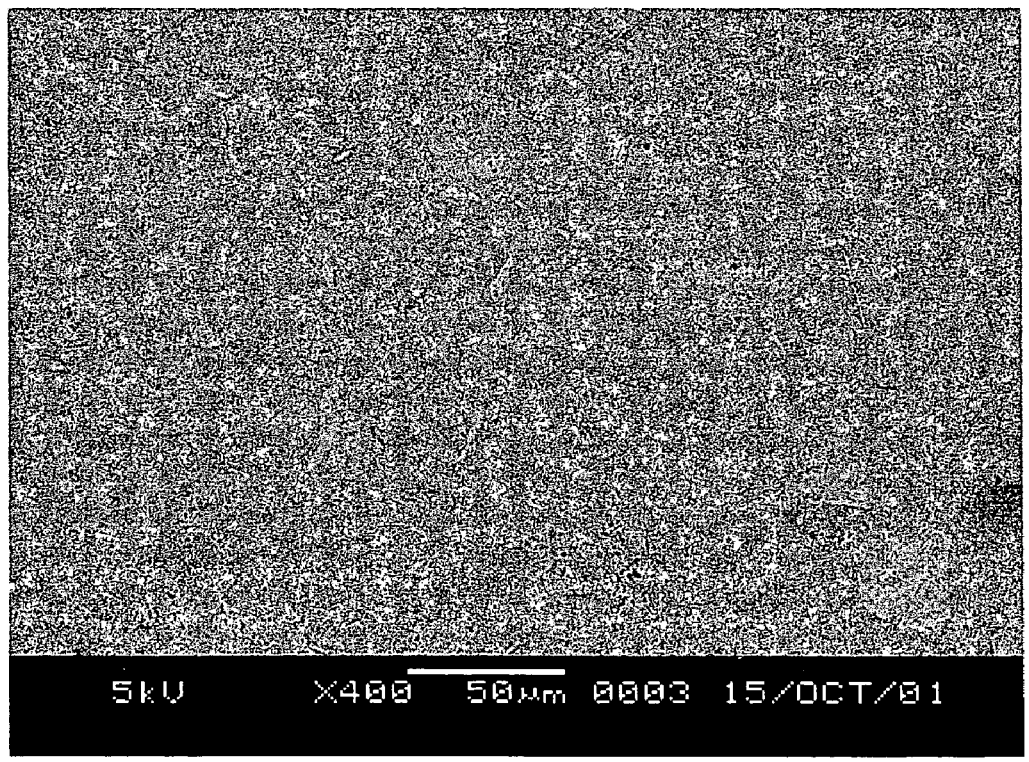
FIG. 10 is a microscopic picture of the surface of a bulk titanium substrate made according to the prior art.

Actually, the two-step process, i.e., the reaction mechanism of the titanium film deposition and synthesis of barium titanate film on Ti-coated substrate of the present invention is completely different from the reaction mechanism of electrochemically anodic oxidation of the prior art method. FIG. 9 is a picture obtained by an electron microscope at magnification 10000 times from a Ti-coated substrate obtained subject to the first step of the new process of the present invention. As illustrated in FIG. 9, the grain size of titanium film is in nano-scale. FIG. 10 is a picture obtained from bulk titanium by an electron microscope at magnification 400 times. As illustrated in FIG. 10, the grain size of the bulk-titanium is about tens of μm, much greater than that of the titanium film shown in FIG. 9. Because titanium particles formed on the heterogeneous substrate according to the first step of the new process of the present invention are fine, synthesis of barium titanate film on Ti-coated substrate by electrochemically anodic oxidation can rapidly be achieved at a processing temperature as low as room temperature.

Subject to the spirit of the present invention, materials, other than silicon, such as ceramics, glass, polymers, other metals, etc. may be used as substrates. Homogeneous (bulk-titanium) substrates can also be used. Such an economical process with simple set-up of instruments, a considerably fast growth rate, and especially a low processing temperature has great potential in mass production and many applications in electronics industry.

What is claimed is:

1. A barium titanate film synthesizing process comprising the steps of:
   (a) coating a titanium film on the surface of a substrate, said titanium film having a grain size which is in nano-scale; and
   (b) synthesizing a barium titanate film on the titanium-coated substrate in an electrolyte containing barium ions by electrochemically anodic oxidation.

2. The barium titanate film synthesizing process as claimed in claim 1, wherein said substrate is selected from the group consisting of titanium, glass, ceramics, polymers, and silicon.

3. The barium titanate film synthesizing process as claimed in claim 1, wherein said titanium film is deposited on said substrate by sputtering.

4. The barium titanate film synthesizing process as claimed in claim 1, wherein said titanium film is deposited on said substrate by evaporation.

5. The barium titanate film synthesizing process as claimed in claim 1, wherein said electrolyte is an alkaline solution of $Ba(CH_3COO)_2$ and NaOH.

6. The barium titanate film synthesizing process as claimed in claim 5, wherein the concentration of $Ba(CH_3COO)_2$ is within about 0.35–0.5 M; the concentration of NaOH is 2 M.

7. The barium titanate film synthesizing process as claimed in claim 1, wherein said electrochemically anodic oxidation is achieved by voltage within 0.4 V~3 V.

8. The barium titanate film synthesizing process as claimed in claim 1, wherein said electrochemically anodic oxidation is achieved by a voltage scan rate within 10 mV/s~50 mV/s.

9. The barium titanate film synthesizing process as claimed in claim 1, wherein said electrochemically anodic oxidation is achieved within 20 seconds to 24 hours.

10. The barium titanate film synthesizing process as claimed in claim 1, wherein said electrochemically anodic oxidation is performed at a processing temperature within 30° C.~90° C.

11. The barium titanate film synthesizing process as claimed in claim 1, wherein said electrochemically anodic oxidation is performed at a processing temperature over 50° C.

12. The barium titanate film synthesizing process as claimed in claim 1, wherein the nano-scale ranges from 1 nm to 100 nm.

* * * * *